(12) United States Patent
Lee et al.

(10) Patent No.: US 11,251,772 B2
(45) Date of Patent: Feb. 15, 2022

(54) ACOUSTIC RESONATOR PACKAGE AND METHOD OF FABRICATING THE SAME

(71) Applicant: SAMSUNG ELECTRO-MECHANICS CO., LTD., Suwon-si (KR)

(72) Inventors: Tae Kyung Lee, Suwon-si (KR); Kwang Su Kim, Suwon-si (KR); Sang Jin Kim, Suwon-si (KR); Seung Wook Park, Suwon-si (KR); Jong Beom Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 654 days.

(21) Appl. No.: 16/177,758

(22) Filed: Nov. 1, 2018

(65) Prior Publication Data
US 2019/0379349 A1 Dec. 12, 2019

(30) Foreign Application Priority Data
Jun. 8, 2018 (KR) .................. 10-2018-0065792

(51) Int. Cl.
| | |
|---|---|
| *H03H 9/10* | (2006.01) |
| *H03H 3/02* | (2006.01) |
| *H03H 9/17* | (2006.01) |
| *H03H 9/05* | (2006.01) |

(52) U.S. Cl.
CPC .............. *H03H 9/105* (2013.01); *H03H 3/02* (2013.01); *H03H 9/0514* (2013.01); *H03H 9/174* (2013.01); *H03H 9/173* (2013.01); *H03H 2003/023* (2013.01)

(58) Field of Classification Search
CPC .......... H03H 9/105; H03H 3/02; H03H 9/174; H03H 9/0514; H03H 9/173; H03H 2003/023
See application file for complete search history.

(56) References Cited

U.S. PATENT DOCUMENTS

| | | | |
|---|---|---|---|
| 8,830,012 B2 | 9/2014 | Pang et al. | |
| 9,203,374 B2* | 12/2015 | Burak | H03H 9/02118 |
| 9,450,518 B2* | 9/2016 | Khan | H02M 7/538 |
| 9,688,528 B2* | 6/2017 | Sano | H01L 41/319 |
| 2003/0231851 A1 | 12/2003 | Rantala et al. | |
| 2011/0304412 A1* | 12/2011 | Zhang | H03H 9/174 |
| | | | 333/187 |
| 2012/0056694 A1* | 3/2012 | Pang | H03H 9/175 |
| | | | 333/187 |
| 2013/0207515 A1* | 8/2013 | Taniguchi | H03H 9/02102 |
| | | | 310/321 |
| 2016/0329481 A1* | 11/2016 | Kim | H03H 9/1014 |
| 2017/0077898 A1* | 3/2017 | Park | H03H 9/173 |

(Continued)

FOREIGN PATENT DOCUMENTS

KR   10-2017-0108377 A   9/2017

*Primary Examiner* — Bryan P Gordon
(74) *Attorney, Agent, or Firm* — NSIP Law

(57) ABSTRACT

An acoustic resonator package includes a substrate, an acoustic resonator disposed on the substrate, the acoustic resonator including a first hydrophobic layer, a cap configured to accommodate the acoustic resonator, a bonding portion configured to bond the substrate to the cap, and a second hydrophobic layer disposed on the substrate at a position between the acoustic resonator and the bonding portion.

12 Claims, 14 Drawing Sheets

(56) References Cited

U.S. PATENT DOCUMENTS

| | | | | |
|---|---|---|---|---|
| 2017/0120458 A1* | 5/2017 | Akaha | ................... | B25J 9/0018 |
| 2017/0179919 A1* | 6/2017 | Yang | ................... | H03H 9/0504 |
| 2017/0271573 A1* | 9/2017 | Kang | ................... | H01L 41/053 |
| 2018/0138888 A1* | 5/2018 | Yoon | ....................... | H01L 41/29 |
| 2018/0351533 A1* | 12/2018 | Lee | ....................... | H03H 9/131 |
| 2019/0007021 A1* | 1/2019 | Taniguchi | .............. | H03H 9/178 |
| 2019/0379349 A1* | 12/2019 | Lee | ..................... | H03H 9/1014 |

* cited by examiner

I-I'

ACOUSTIC RESONATOR PACKAGE AND METHOD OF FABRICATING THE SAME

CROSS-REFERENCE TO RELATED APPLICATION(S)

This application claims benefit under 35 USC § 119(a) of Korean Patent Application No. 10-2018-0065792 filed on Jun. 8, 2018 in the Korean Intellectual Property Office, the disclosure of which is incorporated herein by reference for all purposes.

BACKGROUND

1. Field

This application relates to an acoustic resonator package and a method of fabricating the same.

2. Description of Related Art

With the recent rapid development of mobile or wireless communication devices, chemical devices, biotechnological devices, and similar devices, there is increasing demand for compact and lightweight elements such as filters, oscillators, resonant elements, and acoustic resonant mass sensors that are used in such devices.

A film bulk acoustic resonator (FBAR) is known as a device for implementing such compact and lightweight filters, oscillators, resonant elements, acoustic resonant mass sensors, and similar elements.

Such an FBAR may be mass-produced at minimum cost and may be implemented at a subminiature size. In addition, such an FBAR may be implemented to have a high-quality factor (Q) value, which is the main characteristic of a filter. An FBAR may be used in a microwave frequency band, particularly, in personal communications system (PCS) and digital cordless system (DCS) bands.

In general, an FBAR may have a structure including a resonant portion implemented by sequentially laminating a first electrode, a piezoelectric layer, and a second electrode on a substrate.

The operating principle of the FBAR is such, that when electric energy is applied to the first and second electrodes to induce an electric field in the piezoelectric layer, an electric field may result in a piezoelectric phenomenon in the piezoelectric layer to allow the resonant portion to vibrate in a predetermined direction. As a result, a bulk acoustic wave may be generated in the same direction as the vibration direction of the resonant portion to cause resonance.

That is, an FBAR is a device using bulk acoustic waves (BAW). As an electromechanical coupling coefficient (Kt2) of a piezoelectric body increases, frequency characteristics of an elastic wave device may be improved and a frequency band may be widened.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an acoustic resonator package includes a substrate, an acoustic resonator disposed on the substrate, the acoustic resonator including a first hydrophobic layer, a cap configured to accommodate the acoustic resonator, a bonding portion configured to bond the substrate to the cap, and a second hydrophobic layer disposed on the substrate at a position between the acoustic resonator and the bonding portion.

The bonding portion may include at least one of gold (Au) and an Au alloy.

The bonding portion may include at least one of gold (Au) and an Au alloy.

The bonding portion may include at least one of copper (Cu), a Cu alloy, aluminum (Al), and an Al alloy, and the second hydrophobic layer is disposed to be spaced apart from the bonding portion.

The acoustic resonator may include an insulating layer disposed on the substrate, a membrane layer disposed on the insulating layer, a cavity formed by the insulating layer and the membrane layer, a resonant portion in which a first electrode, a piezoelectric layer and a second electrode are laminated, the resonant portion being disposed above the cavity, and a protective layer disposed on the resonant portion, wherein the first hydrophobic layer is disposed on the protective layer.

The first electrode and the second electrode may extend outwardly of the resonant portion, a first metal layer may be disposed on the extended first electrode, a second metal layer may be disposed on the extended second electrodes, and the first hydrophobic layer is additionally disposed on the first metal layer and the second metal layer.

The first metal layer and the second metal layer may include at least one of copper (Cu) and aluminum (Al).

The first hydrophobic layer may additionally be disposed on a top surface of the cavity.

The first hydrophobic layer may additionally be disposed on at least a portion of a bottom surface of the cavity and a side surface of the cavity.

Each of the first hydrophobic layer and the second hydrophobic layer may be one of a monolayer and a self-assembled monolayer.

The first hydrophobic layer and the second hydrophobic layer may include a fluorine (F) component.

The first hydrophobic layer and the second hydrophobic layer may further include a silicon (Si) component.

In a general aspect, a method of fabricating an acoustic resonator package includes forming an acoustic resonator on one surface of a substrate, forming a first bonding portion on the substrate, forming a hydrophobic layer on the acoustic resonator and the substrate; and bonding a second bonding portion formed on one surface of a cap to the first bonding portion to accommodate the acoustic resonator.

The forming of the acoustic resonator may include forming an insulating layer on the substrate, forming a sacrificial layer on the insulating layer and forming a pattern to penetrate the sacrificial layer, forming a membrane layer on the sacrificial layer, sequentially laminating a first electrode, a piezoelectric layer, and a second electrode on the membrane layer, to form a resonant portion, removing a portion of the sacrificial layer to form a cavity; and forming a protective layer on the resonant portion.

The first bonding portion may include gold (Au).

The method may include forming a blocking layer on an external surface of the first bonding portion after forming the first bonding portion; and removing the blocking layer before bonding the cap to the substrate, after forming the hydrophobic layer.

In a general aspect, a method of fabricating an acoustic resonator package includes forming an acoustic resonator on one surface of a substrate, forming a blocking layer in an area of the substrate where a bonding portion is to be formed, forming a hydrophobic layer on the acoustic resonator and the substrate, removing the blocking layer and forming the bonding portion on the substrate; and bonding a cap to the bonding portion to accommodate the acoustic resonator.

An insulating layer may be formed on the substrate and a sacrificial layer may be formed on the insulating layer.

A cavity may be formed in the sacrificial layer.

A membrane layer may be disposed on the sacrificial layer to define a thickness of the cavity.

Other features and aspects will be apparent from the following detailed description, the drawings, and the claims.

Figure 1:
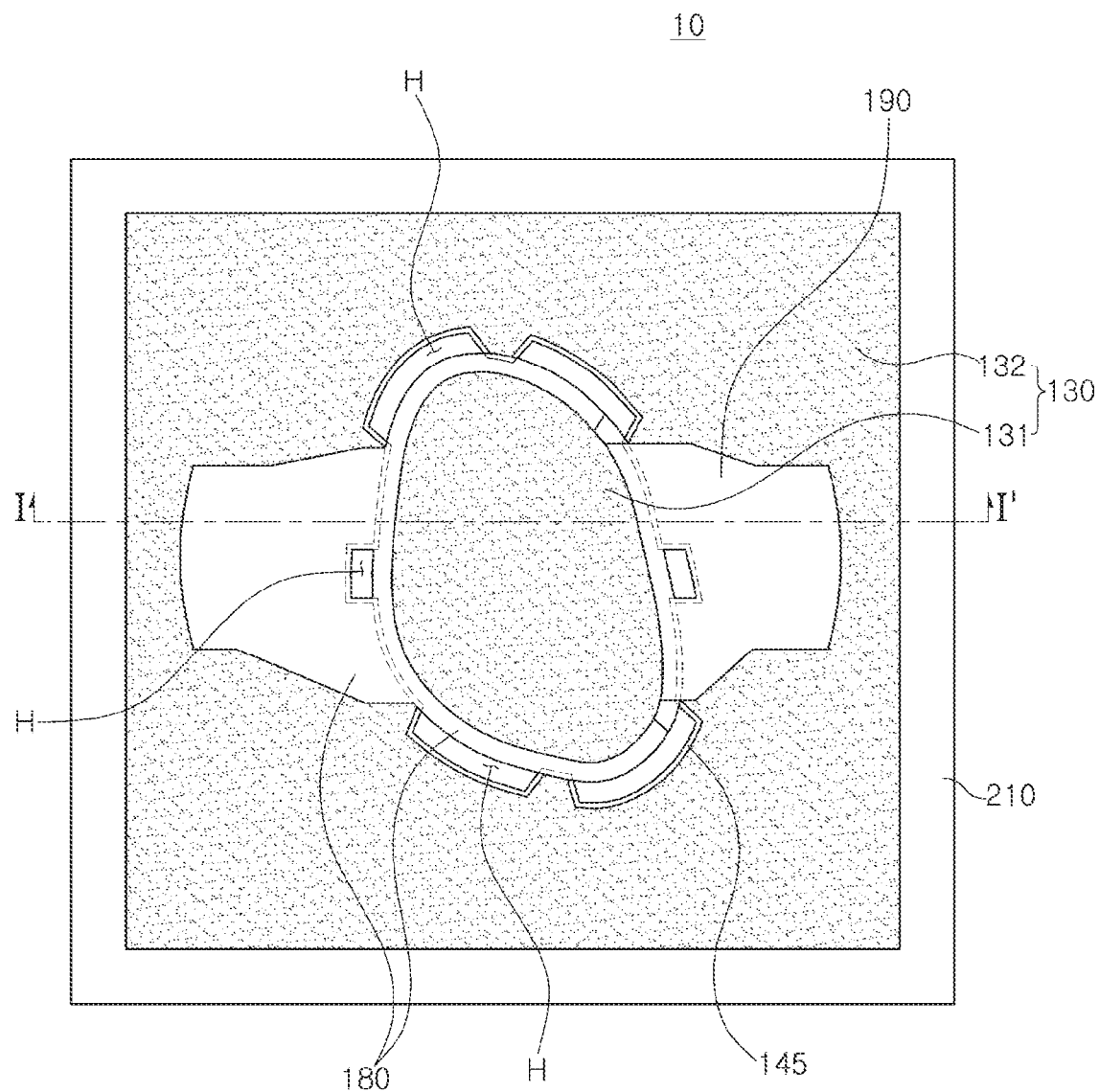
FIG. 1 is a plan view of an acoustic resonator package according to an example, in which a cap portion is not shown.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Acoustic Resonator Package

Figure 2:
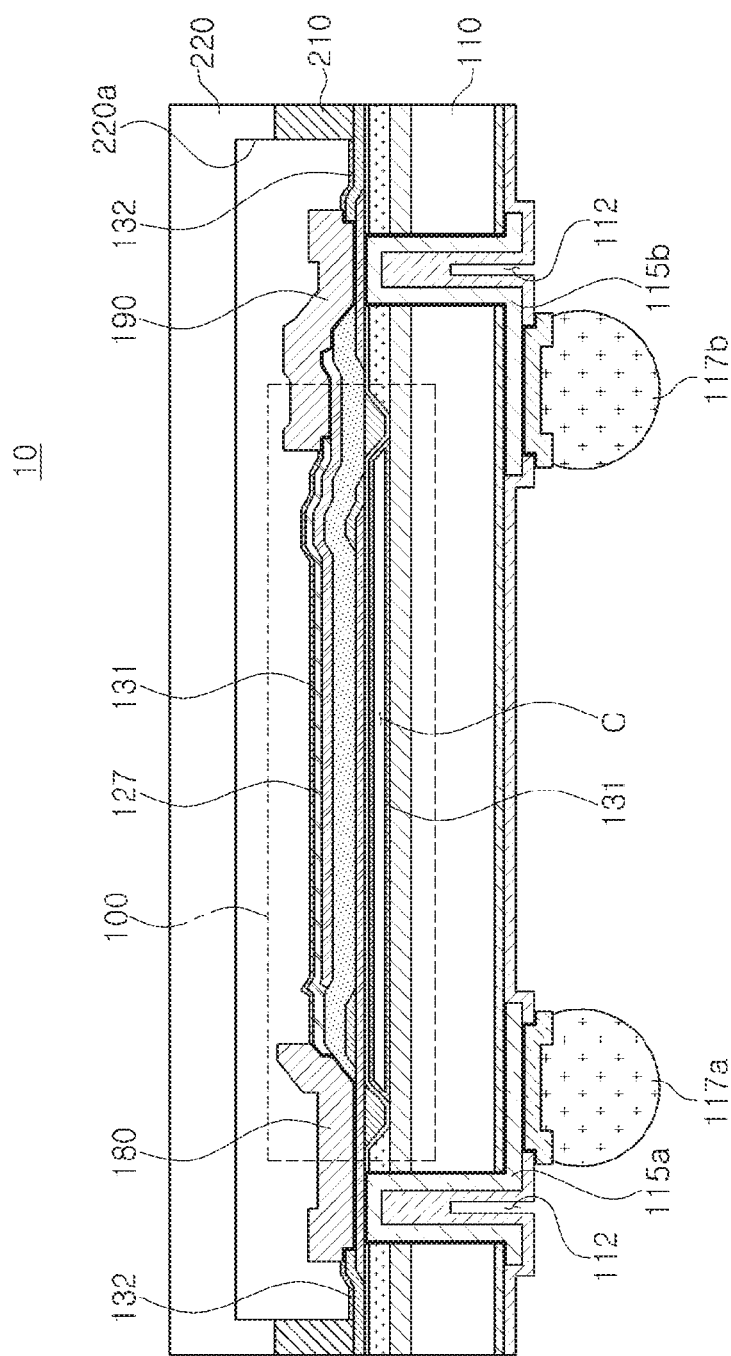
FIG. 2 is a cross-sectional view of the acoustic resonator package of FIG. 1.

FIG. 1 is a plan view of an acoustic resonator package according to an example, in which a cap portion is not shown. FIG. 2 is a cross-sectional view of FIG. 1, and FIG. 3 is an enlarged cross-sectional view of an acoustic resonator portion as illustrated in the example in FIG. 2.

Figure 3:
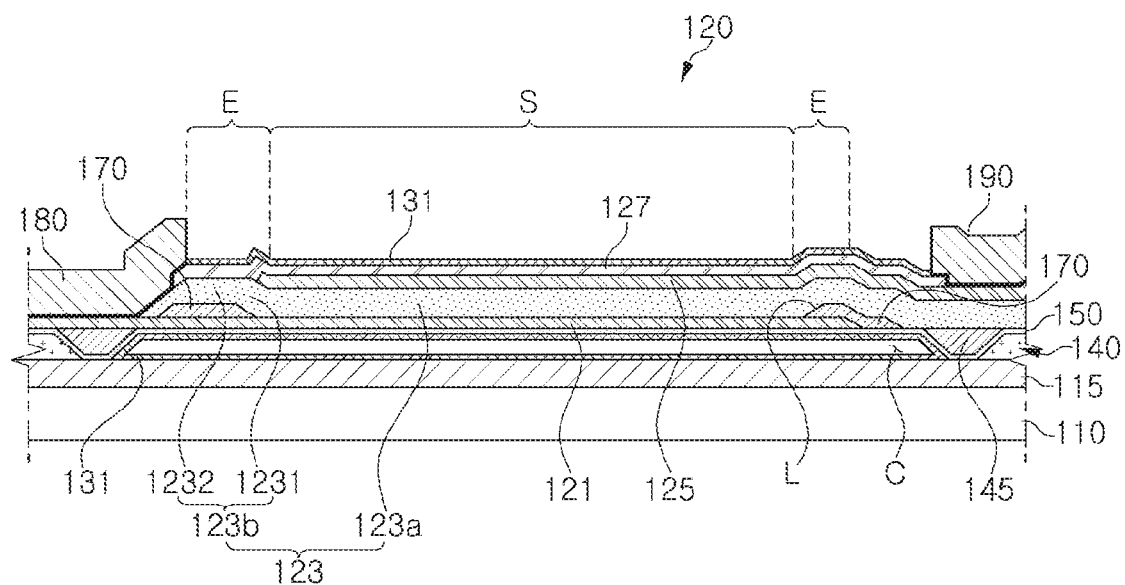
FIG. 3 is an enlarged cross-sectional view of an acoustic resonator portion in FIG. 2.

Referring to FIGS. 1 to 3, an acoustic resonator package 10 according to an example includes a substrate 110, an acoustic resonator 100, a cap 220, a bonding portion 210, and a hydrophobic layer 130.

The hydrophobic layer 130 includes a first hydrophobic layer 131 disposed in the acoustic resonator 100 and a second hydrophobic layer 132 disposed on a substrate between the acoustic resonator 100 and the bonding portion 210.

For example, the acoustic resonator package 10 includes the substrate 110, the acoustic resonator 100 disposed on the substrate 110 and including the first hydrophobic layer 131, the cap 220 configured to accommodate the acoustic resonator 100, the bonding portion 210 configured to bond the substrate 110 and the cap 220 to each other, and the second hydrophobic layer 132 disposed between the acoustic resonator 100 and the bonding portion 210.

The acoustic resonator 100 is not limited thereto and may be a film bulk acoustic resonator (FBAR). Hereinafter, a bulk acoustic resonator will be described as an example of the acoustic resonator 100.

The acoustic resonator 100 may include a substrate 110, an insulating layer 115, a membrane layer 150, a cavity C, a resonant portion 120, a protective layer 127, and a hydrophobic layer 130 (131/132).

In an example, the substrate 110 may be a silicon substrate, but is not limited thereto. For example, a silicon wafer or a silicon-on-insulator (SOI) substrate may be used as the substrate 110.

The insulating layer 115 may be prepared on a top surface of the substrate 110 to electrically isolate the substrate 110 and the resonant portion 120 from each other. Additionally, the insulating layer 115 may prevent the substrate 110 from being etched by an etching gas when the cavity C is formed during fabrication of the acoustic resonator 100.

In an example, the insulating layer 115 may be formed of at least one of silicon dioxide ($SiO_2$), silicon nitride ($Si_3N_4$), aluminum oxide ($Al_2O_3$), and aluminum nitride (AlN), and may be formed on the substrate 110 through any one of chemical vapor deposition (CVD), radio frequency (RF) magnetron sputtering, and evaporation.

A sacrificial layer 140 may be provided on the insulating layer 115. The cavity C and an etch-stop portion 145 may be disposed inside the sacrificial layer 140.

The cavity C is formed as an air-filled void and may be formed by removing a portion of the sacrificial layer 140.

Since the cavity C is formed in the sacrificial layer 140, the resonant portion 120 may be entirely flat.

The etch-stop portion 145 may be disposed along a boundary of the cavity C. The etch-stop portion 145 is provided to prevent etching from proceeding beyond a cavity region during formation of the cavity C. Accordingly, a horizontal area of the cavity C may be defined by the etch-stop portion 145 and a vertical area of the cavity C may be defined by a thickness of the sacrificial layer 140.

The membrane layer 150 may be disposed on the sacrificial layer 140 to define a thickness (or height) of the cavity C together with the substrate 110. The membrane layer 150 may also be formed of a material which is not easily removed during formation of the cavity C.

For example, when a halide-based etching gas such as fluorine (F), chlorine (Cl) or a similar gas is used to remove a portion of the sacrificial layer 140 (e.g., a cavity region), the membrane layer 150 may be formed of a material having a low reactivity with the etching gas. In this example, the membrane layer 150 may include at least one of silicon dioxide ($SiO_2$) and silicon nitride ($Si_3N_4$).

The membrane layer 150 may include a dielectric layer containing at least one of manganese oxide (MgO), zirconium oxide ($ZrO2$), aluminum nitride (AlN), lead zirconate titanate (PZT), gallium arsenide (GaAs), hafnium oxide ($HfO_2$) aluminum oxide ($Al_2O_3$), titanium oxide ($TiO_2$), and zinc oxide (ZnO) or a metal layer containing at least one of aluminum (Al), nickel (Ni), chromium (Cr), platinum (Pt), gallium (Ga), and hafnium (Hf), but is not limited thereto.

A seed layer (not shown) formed of aluminum nitride (AlN) may be disposed on the membrane layer 150. More specifically, the seed layer may be disposed between the membrane layer 150 and the first electrode 121. The seed layer may be formed of a dielectric or metal having an HCP structure in addition to aluminum nitride (AlN). In the case of a metal, the seed layer may be formed of titanium (Ti).

The resonant portion 120 includes the first electrode 121, a piezoelectric layer 123, and the second electrode 125. The first electrode 121, the piezoelectric layer 123, and the second electrode 125 may be sequentially laminated from bottom to top. Accordingly, the piezoelectric layer 123 may be disposed between the first electrode 121 and the second electrode 125.

Since the resonant portion 120 may be disposed on the membrane layer 150, the membrane layer 150, the first electrode 121, the piezoelectric layer 123, and the second electrode 125 may be sequentially laminated to constitute the resonant portion 120.

The resonant portion 120 may cause the piezoelectric layer 123 to resonate according to a signal applied to the first and second electrodes 121 and 125 to generate a resonant frequency and an anti-resonant frequency.

When an insertion layer 170 is provided, the resonant portion 120 may be divided into a center portion S in which the first electrode 121, the piezoelectric layer 123, and the second electrode 125 are laminated roughly flat and an extending portion E in which the insertion layer 170 is interposed between the first electrode 121 and the piezoelectric layer 123. The insertion layer 170 will be described below.

The center portion S is disposed in the center of the resonant portion 120, and the extending portion E is disposed along a periphery of the center portion S. Thus, the extending portion E refers to a region extending outward from the center portion S.

The insertion layer 170 may have an inclined surface L which becomes thicker as a distance from the center portion S increases.

In the extending portion E, the piezoelectric layer 123 and the second electrode 125 are disposed on the insertion layer 170. Accordingly, the piezoelectric layer 123 and the second electrode 125 have an inclined surface following a shape of the insertion layer 170.

In the present example, the extending portion E is defined as being included in the resonant portion 120, and thus resonance may also occur in the extending portion E. However, occurrence of the resonance is not limited thereto. According to a structure of the extending portion E, the resonance may only occur in the center portion S, and excluding the extending portion E.

Each of the first and second electrodes 121 and 125 may be formed of a conductor. For example, each of the first and second electrodes 121 and 125 may be formed of gold (Au), molybdenum (Mo), ruthenium (Ru), iridium (Ir), aluminum (Al), platinum (Pt), titanium (Ti), tungsten (W), palladium (Pd), tantalum (Ta), chromium (Cr), nickel (Ni) or a metal containing at least one thereof, but a material thereof is not limited thereto.

In the resonant portion 120, the first electrode 121 may be formed to have a larger area than the second electrode 125, and a first metal 180 may be disposed along the outer edge of the first electrode 121. Accordingly, the first metal layer 180 may be disposed in the form of surrounding the second electrode 125.

Since the first electrode 121 may be disposed on the membrane layer 150, the first electrode 121 may be entirely flat. Meanwhile, since the second electrode is disposed on the piezoelectric layer 123, bending may be formed to correspond to a shape of the piezoelectric layer 123.

The second electrode 125 may be entirely disposed in the center portion S and may be partially disposed in the extending portion E. Accordingly, the second electrode 125 may be divided into a portion disposed on a piezoelectric portion 123a of the piezoelectric layer 123 and a portion disposed on a bent portion 123b of the piezoelectric layer 123. The piezoelectric portion 123a and the bent portion 123b will be described below.

More specifically, the second electrode 125 may be disposed to cover the entirety of the piezoelectric portion 123a and a portion of the inclined portion 1231 of the piezoelectric layer 123. Accordingly, the second electrode 125a disposed in the extending portion E may have a smaller area than an inclined surface of the inclined portion 1232 and, in the resonant portion 120, the second electrode 125 may have a smaller area than the piezoelectric layer 123.

In an example, the piezoelectric layer 123 may be disposed on the first electrode 121. In the example that the insertion layer 123 is provided, the piezoelectric layer 123 may be disposed on the first electrode 121 and the insertion layer 170.

As a material of the piezoelectric layer 123, zinc oxide (ZnO), aluminum nitride (AlN), doped aluminum nitride, lead zirconate titanate, quartz, and similar materials may be selectively used. The doped aluminum nitride may further include a rare earth metal, a transition metal or an alkaline earth metal. For example, the rare earth metal may include at least one of scandium (Sc), erbium (Er), yttrium (Y), and lanthanum (La) and a content of the rare earth metal may be 1 to 20 atomic percent (at %). The transition metal may include at least one of hafnium (Hf), titanium (Ti), zirconium (Zr), tantalum (Ta), and niobium (Nb. The alkaline earth metal may include magnesium (Mg).

The piezoelectric layer 123 includes a piezoelectric portion 123a disposed in the center portion S and a bent portion 123b disposed in the extending portion E.

The piezoelectric portion 123a is a portion directly laminated on a top surface of the first electrode 121. Accordingly, the piezoelectric portion 123a may be interposed between the first electrode 121 and the second electrode 125 to be in a flat form with the first electrode 121 and the second electrode 125.

The bent portion 123b may extend outward from the piezoelectric portion 123a to be defined as a region disposed in the extending portion E.

The bent portion 123b is disposed on the insertion layer 170 and is raised following a shape of the insertion layer 170. The piezoelectric layer 123 is bent at a boundary between the piezoelectric portion 123a and the bent portion 123b and is raised to correspond to a thickness and a shape of the insertion layer 170.

The bent portion 123b may be divided into an inclined portion 1231 and an extending portion 1232.

The inclined portion 1231 refers to a portion that is inclined along the inclined surface L of the insertion layer 170, and the extending portion 1232 refers to a portion that extends outward from the inclined portion 1231.

The inclined portion 1231 is disposed parallel to the inclined surface L of the insertion layer 170, and an inclined angle of the inclined portion 1231 may be the same as an inclined angle of the inclined surface L of the insertion layer 170.

The insertion layer 170 may be disposed along a surface formed by the membrane layer 150, the first electrode 121, and the etch-stop layer 145.

The insertion layer 170 may be disposed on the periphery of the center portion S to support the bent portion 123b of the piezoelectric layer 123. Accordingly, the bent portion 123b of the piezoelectric layer 123 may be divided into the inclined portion 1231 and the extended portion 1232, following a shape of the insertion layer 170.

The insertion layer 170 may be disposed in a region that is separate from the center portion S. For example, the insertion layer 170 may be disposed in the entire region except for the center portion S or in a partial region.

At least a portion of the insertion layer 170 may be disposed between the piezoelectric layer 123 and the first electrode 121.

A side surface of the insertion layer 170 disposed along a boundary of the center portion S becomes thicker as a distance from the center portion S increases. Thus, a side surface of the insertion layer 170 disposed adjacent to the center portion S is formed as an inclined surface L having a constant inclined angle.

If the side surface of the insertion layer 170 is formed to have an inclined angle $\theta$ smaller than 5 degrees, the insertion layer 170 should be very thin or the inclined surface L should have an excessively large area. Accordingly, there is difficulty in substantially implementing the insertion layer 170 having the inclined angle $\theta$ less than 5 degrees.

On the other hand, if the side surface of the insertion layer 170 is formed to have an inclined angle greater than 70 degrees, the inclined portion 1231 of the piezoelectric layer 123 laminated on the piezoelectric layer 170 may also be formed to have an inclined angle greater than 70 degrees. In this example, since the piezoelectric layer 123 is excessively bent, cracking may occur at the bent portion of the piezoelectric layer 123.

As a result, the inclined surface L may be formed to have an inclined angle $\theta$ ranging from 5 degrees to 70 degrees.

The insertion layer 170 may be formed of a dielectric material such as silicon oxide ($SiO_2$), aluminum nitride (AlN), aluminum oxide ($Al_2O_3$), silicon nitride (SiN), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), but may be formed of a material different from the material of the piezoelectric layer 123. If necessary, a region in which the insertion layer 170 is provided may be formed as an air-filled cavity, which may be implemented by removing the insertion layer 170 after the resonant portions 120 are completely formed during the manufacturing process.

In the present example, a thickness of the insertion layer 170 may be equal or similar to the thickness of the first electrode 121.

Additionally, the thickness of the insertion layer 170 may be less than the thickness of the piezoelectric layer 123. For this reason, an inclined portion of the piezoelectric layer 123 may be formed due to the insertion layer 170 and a crack may be prevented from occurring, which may contribute to performance improvement of the acoustic resonator. There is no need to limit a lower limit of the thickness of the insertion layer 170, but the thickness of the insertion layer 170 may be more than or equal to 100 angstroms (Å) to easily adjust a deposition thickness and to ensure uniformity of thickness in a deposited wafer.

The above-configured resonant portion 120 is disposed to be spaced apart from the substrate 110 through the cavity C formed as an air-filled void.

The cavity C may be formed by supplying an etching gas (or an etching solution) to an introduction hole (H in FIGS. 1 and 3) to remove a portion of the sacrificial layer 140 during the manufacturing process.

The protective layer 127 may be disposed along a surface of the acoustic resonator 100 to protect the acoustic resonator 100 from external elements. The protective layer 127 may be disposed along a surface formed by the second electrode 125, the piezoelectric layer 1273, and the insertion layer 170.

The protective layer 127 may be formed of one of silicon oxide-based, silicon nitride-based, aluminum oxide-based, and aluminum nitride-based insulating materials.

The protective layer 127 may be additionally disposed on the substrate 110 between the acoustic resonator 100 and the bonding portion 210. The second hydrophobic layer may be disposed on the additionally disposed protective layer 127.

The first electrode 121 and the second electrode 125 extend outwardly of the resonant portion 120. The first metal layer 180 and the second metal layer 190 are disposed on top surfaces of the extending portions, respectively.

Each of the first and second metal layers 180 and 190 may be formed of gold (Au), gold-tin (Au—Sn) alloy, copper (Cu), copper-tin (Cu—Sn) alloy, aluminum (Al), aluminum-germanium (Al—Ge) alloy or the like.

The first and second metal layers 180 and 190 may function as connection wirings configured to electrically connect electrodes of another acoustic resonator disposed adjacent to the first and second electrodes 121 and 125 of the acoustic resonator 100 or external connection terminals. However, the functions of the first and second metal layers 180 and 190 are not limited thereto.

Although a structure in which the insertion layer 170 is removed below the second metal layer 190 is shown in FIG. 2, the configuration of the present disclosure is not limited thereto. If necessary, a structure in which the insertion layer 170 is disposed below the second metal layer 190 may be implemented.

The first metal layer 180 is bonded to the first electrode 121 through the insertion layer 170 and the protective layer 127.

As shown in FIG. 3, the first electrode 121 has a larger area than the second electrode 125 and the first metal 180 is disposed on a periphery of the first electrode 121.

Accordingly, the first metal layer 180 is disposed along the periphery of the resonant portion 120 to surround the second electrode 125, but is not limited thereto.

As mentioned above, the second electrode 125 may be laminated on the piezoelectric portion 123a and the inclined portion 1231 of the piezoelectric layer 123. A portion of the second electrode 125 disposed on the inclined portion 1231 of the piezoelectric layer 123, i.e., the second electrode 125 disposed in the extending portion E, may be disposed only on a portion of the inclined surface of the inclined portion 1231 rather than the entire surface of the inclined portion 1231.

The hydrophobic layer 130 may be disposed on the protective layer 127.

When an acoustic resonator package is used in a humid environment or left at room temperature for a long period of time, a defect may occur at a bonding portion of the package, and the package may lose hermeticity. In this case, a hydroxyl group (OH group) was adsorbed on the inside of the package, particularly, a protective layer and a substrate between an acoustic resonator and the bonding portion to increase frequency variation or degrade performance of the acoustic resonator.

Figure 4:
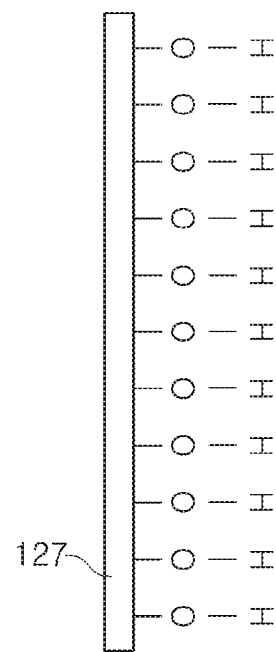
FIG. 4 illustrates an example that a hydroxyl group is adsorbed on a protective layer on which a hydrophobic layer is not formed.
Figure 5:
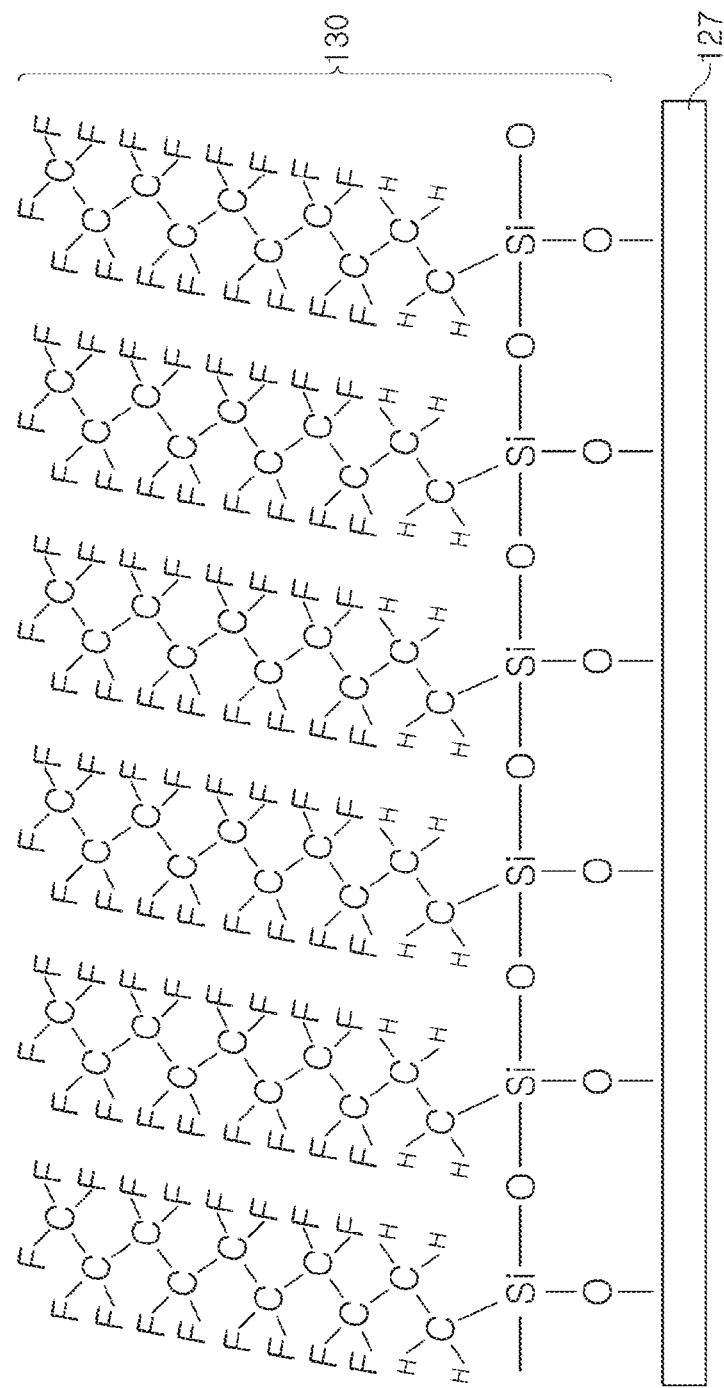
FIG. 5 illustrates an example that a hydrophobic layer is formed on a protective layer.

FIG. 4 shows that a hydroxyl group is adsorbed on a protective layer on which a hydrophobic layer is not formed, and FIG. 5 shows that a hydrophobic layer is formed on a protective layer.

Referring to FIG. 4, when an acoustic resonator package is used in a humid environment or left at room temperature for a long period of time without formation of a hydrophobic layer, a hydroxyl group (OH group) may be adsorbed on a protective layer to form hydroxylate. Since hydroxylate has high surface energy and is unstable, mass loading occurs because the hydroxylate tries to absorb water or the like to reduce its surface energy.

In an example, referring to FIG. 5, hydroxylate has low surface energy and is stable when the hydrophobic layer 130 is disposed on the protective layer 127. Accordingly, there is no need to lower surface energy by adsorbing water and a hydroxyl group (OH group) and the like. Since the hydrophobic layer serves to prevent adsorption of the water and the hydroxyl group (OH group), frequency variation may be significantly reduced to uniformly maintain performance of the acoustic resonator.

Figure 6:
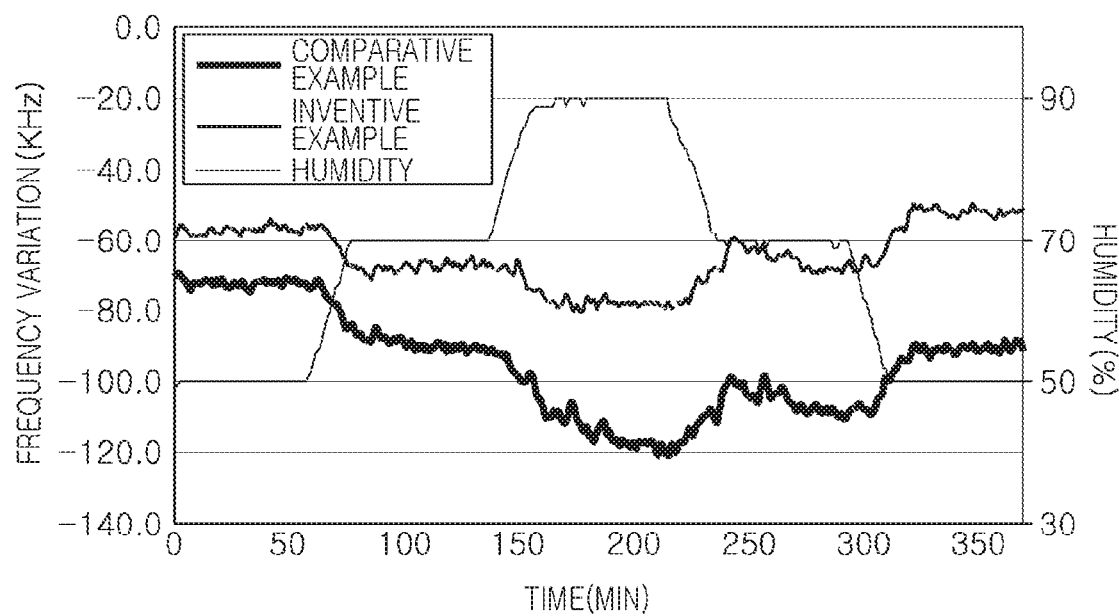
FIG. 6 is an example of a graph illustrating frequency variations depending on humidity and time for an acoustic resonator package (Example) in which a first hydrophobic layer is formed on a protective layer of an acoustic resonator, and a second hydrophobic layer is formed on a substrate between the acoustic resonator and a bonding portion and an acoustic resonator package (Comparative Example) in which a hydrophobic layer is not formed on a substrate between a protective layer and a bonding portion of an acoustic resonator.

FIG. 6 is a graph illustrating frequency variations depending on humidity and time for an acoustic resonator package (Inventive Example) in which a first hydrophobic layer is formed on a protective layer of an acoustic resonator and a second hydrophobic layer is formed on a substrate between the acoustic resonator and a bonding portion and an acoustic resonator package (Comparative Example) in which a hydrophobic layer is not formed on a substrate between a protective layer and a bonding portion of an acoustic resonator. In the test, the Inventive Example and the Comparative Example were placed inside a moisture absorption chamber and frequency variation was measured while varying humidity, as shown in FIG. 6.

As can be seen from FIG. 6, the Example has much smaller frequency variations depending on humidity and time the comparative example. Also, as can be seen from FIG. 6, in the case of the Inventive Example, the frequency variation at the end of the test is smaller than the frequency variation at the start of the test.

Figure 7A:
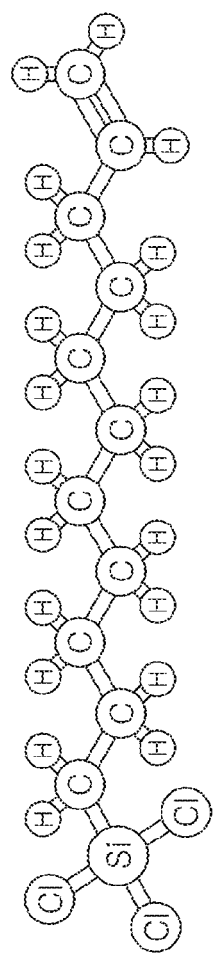
FIGS. 7A and 7B illustrate a molecular structure of a precursor used as an adhesion layer of a hydrophobic layer.
Figure 7B:
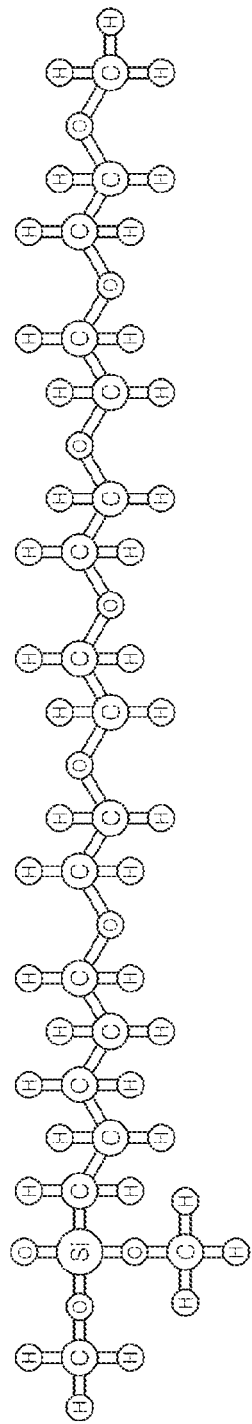

A precursor may be used to improve an adhesion between the hydrophobic layer 130 and the protective layer 127. Referring to FIG. 7, the precursor may be (a) a hydrocarbon having a silicon head or (b) silioxane having a silicon head.

Figure 8:
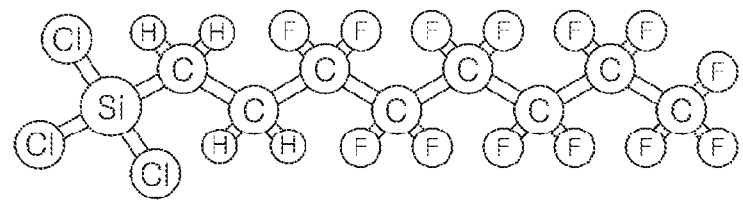
FIG. 8 illustrates an example of a molecular structure of a hydrophobic layer.

Referring to FIG. 8, the hydrophobic layer 130 may be formed of fluorocarbon but is not limited thereto. The hydrophobic layer 130 may be formed of a material having a contact angle of 90 degrees or more with water after being deposited. For example, the hydrophobic layer 130 may contain a fluorine (F) component and may include fluorine (F) and silicon (Si).

In this example, the hydrophobic layer 130 may be formed of a monolayer or a self-assembled monolayer (SAM) rather than a polymer and may be formed to have a thickness of 100 angstroms or less. When the hydrophobic layer 130 is formed of a polymer, the mass generated by the polymer affects the resonator 120. However, since the hydrophobic layer 130 includes a monolayer or a self-assembled monolayer (SAM) and may be formed to have a thickness of 100 angstroms (Å) or less, frequency variations of an acoustic resonator may be significantly reduced.

When the hydrophobic layer 130 is formed of a polymer within the cavity C through an introduction hole (H in FIGS. 1 and 3), a thickness of the hydrophobic layer 130 within the cavity C may be non-uniform. A portion of the hydrophobic layer 130 near the introduction hole H may be thick, and a portion of the hydrophobic layer 130 in the center of the cavity C far from the introduction hole H may be thin. However, since the hydrophobic layer 130 includes a monolayer or a self-assembled monolayer (SAM), a position-dependent thickness of the hydrophobic layer 130 within the cavity C is uniform.

As will be described later, the hydrophobic layer 130 is formed after the first metal layer 180 and the second metal layer 190 are formed. Therefore, the hydrophobic layer 130 may be formed on the protective layer 127 except for a portion on which the first metal layer 180 and the second metal layer 190 are formed.

According to materials of the first metal layer 180 and the second metal layer 190, a hydrophobic layer may also be formed on the first metal layer 180 and the second metal layer 190. For example, when the first and second metal layers 180 and 190 are formed of a metal such as copper (Cu) or aluminum (Al) whose surface is easily oxidized, the hydrophobic layer 130 may also be formed on the first metal layer 180 and the second metal layer 190.

Moreover, a hydrophobic layer may also be formed on a top surface of the cavity C in addition to the protective layer 127. As will be described later, a hydrophobic layer may be formed on the top surface of the cavity C at the same time as a hydrophobic layer is formed on the protective layer 127. In addition, a hydrophobic layer may be formed on the top surface of the cavity C as well as at least one portion of a bottom surface and a side surface of the cavity C.

Since a resonant portion 120 is disposed above the cavity C, a top surface of the cavity C also affects frequency variations of an acoustic resonator. Accordingly, if a hydrophobic layer is formed on the top surface of the cavity C, the frequency variations of the acoustic resonator may be significantly reduced.

A plurality of via holes 112 may be formed on one of a top surface or a bottom of the substrate 110 to penetrate the substrate 110. First and second connection conductors 115a and 115b may be formed in the respective via holes 112. The first and second connection conductors 115a and 115b may be formed on an inner surface, i.e., an entire inner wall of the via hole 112, but is not limited thereto. One end of the first connection conductor 115a may be connected to an external electrode 117a disposed on the bottom surface of the substrate 110, and the other end of the first connection conductor 115a may be electrically connected to the first electrode 121 or the second electrode 125. One end of the second connection conductor 115b may be connected to an external electrode 117b disposed on the bottom surface of the substrate 110, and the other end of the second connection conductor 115b may be electrically connected to the first electrode 121 or the second electrode 125.

For example, the first connection conductor 115a electrically connects the first electrode 121 to the external electrode 117a, and the second connection conductor 115b electrically connects the second electrode 125 to the external electrode 117b.

In FIG. 2, only two via holes 112 and two connection conductors 115a and 115b are shown and described. However, the number of via holes and connection conductors is not limited thereto. If necessary, more via holes 112 and more connection conductors 115a and 115b may be provided.

The cap 220 is provided to protect the acoustic resonator 110 from an external environment.

The cap 220 has a shape of a cover having an internal space in which the acoustic resonator 100 is accommodated. Accordingly, a sidewall of the cap 220 is bonded to the substrate 110 in the form of surrounding a periphery of the resonant portion 120. A bottom surface of the sidewall 220a may be bonded to the substrate 110 by the bonding portion 210.

A material of the cap 220 is not particularly limited. For example, the material of the cap 220 may be a silicon wafer, may include a polymer material such as a thermosetting resin, a thermoplastic resin or the like, or may include a known metal material, a semiconductor material, and the like, but is not limited thereto.

A bonding portion 210 serves to bond the cap 220 to the substrate 110 to maintain hermeticity inside the acoustic resonator package.

The bonding portion 210 may include a parent material, a melting material, and alloys thereof used in eutectic bonding or metal diffusion bonding.

For example, the parent material may include Cu, Au, Ag, Ni, Al, Pb, and the like, and the melting material may include Sn, In, Si, Zn, and the like. The alloys may include $Au_3Sn$, $Cu_3Sn$, Al—Ge, and the like, but the material is not limited thereto.

When the cap 220 is formed of a material containing an organic insulating material, the bonding portion 210 may include a polymer to ensure bonding strength. For example, when the cap 220 is an organic insulating film or a resin coated copper (RCC), the bonding portion 210 may include a polymer.

When a hydrophobic layer is provided on the bonding portion 210, the bonding strength is lowered such that hermeticity inside the acoustic resonator package may not be maintained.

When the bonding portion 210 is formed of a material such as gold (Au), gold-tin (Au—Sn) alloy or the like, on which a hydrophobic layer is difficult to be deposited. Accordingly, there is no concern that the bonding strength is lowered by the hydrophobic layer. For example, referring to a manufacturing method that will be described below, when the first bonding portion 211 includes gold (Au), a hydrophobic layer may be difficult to deposit on the first bonding portion 211 during formation of the hydrophobic layer. Accordingly, there is no concern that the bonding strength is lowered.

However, when the bonding portion 210' (FIG. 16) includes a material such as copper (Cu), copper-tin (Cu—Sn) alloy, aluminum (Al), aluminum-germanium (Al—Ge) alloy, and the like on which a hydrophobic layer is easy to be deposited, a blocking layer B is formed on a first bonding portion 211' (FIG. 16) to reliably block formation of a hydrophobic layer and then the blocking layer B is removed. The manufacturing method will be described below. Thus, the second hydrophobic layer 132 may be disposed to be spaced apart from a bonding portion. For example, when the first bonding portion 211' includes copper (Cu) or aluminum (Al), the second hydrophobic layer 132 may be disposed to be spaced apart from the bonding portion.

When a bonding portion 210" includes a polymer, a blocking layer B is formed in a portion in which a bonding portion is to be formed and then the blocking layer B is removed. Thus, the second hydrophobic layer 132 is disposed to be spaced apart from the bonding portion. For example, the polymer may be epoxy, siloxane, polyimide, polybenzoxazole (PBO), novolac, benzocyclobutene (BCB), acrylic or the like, but is not limited thereto.

However, when a sufficient bonding strength can be secured although a hydrophobic layer is not formed only in a certain area of a bonding portion, the second hydrophobic layer 132 may not be disposed to be spaced apart from the boding portion. Accordingly, the second hydrophobic layer 132 does not have to be spaced apart from the bonding portion. Note that a structure in which the second hydrophobic layer 132 and the bonding portion are not spaced apart from each other is not excluded in examples of the present disclosure.

Figure 9:
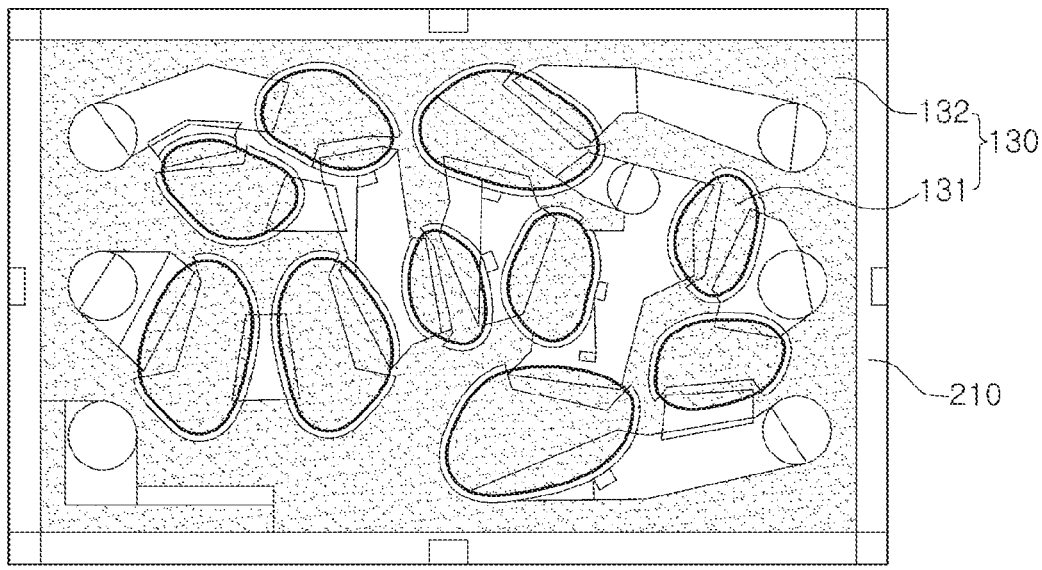
FIGS. 9 and 10 illustrate acoustic resonator packages including a plurality of acoustic resonators according to other examples.
Figure 10:
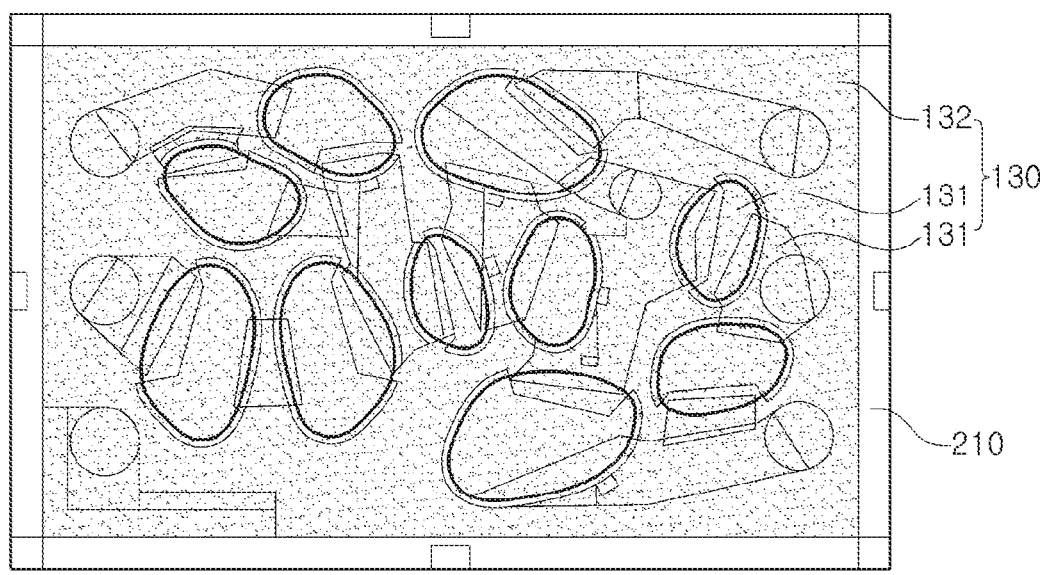

FIGS. 9 and 10 illustrate acoustic resonator packages including a plurality of acoustic resonators according to other examples.

As shown in FIGS. 9 and 10, a plurality of acoustic resonators are arranged inside an acoustic resonator package 20 and 30. According to the arrangement of the plurality of the acoustic resonators, a ladder-type filter structure, a lattice-type filter structure or a combination filter structure thereof may be implemented.

As shown in FIG. 9, a hydrophobic layer 130 (which includes layers 131 and 132) may be disposed in a region except for a bonding portion 210 and a metal layer of the acoustic resonator. As shown in FIG. 10, a hydrophobic layer 130 (which includes layers 131 and 132) may be disposed in all regions except for a bonding portion 210. For example, when a metal layer includes gold (Au), gold-tin (Au—Sn) alloy or similar materials on which it may be difficult to deposit a hydrophobic layer, the acoustic resonator package may have a shape shown in FIG. 9. When a metal layer includes copper (Cu), copper-tin (Cu—Sn) alloy, aluminum (Al), aluminum-germanium (Al—Ge) alloy or similar types of metals on which a hydrophobic layer may easily be deposited, the acoustic resonator package may have a shape such as that shown in FIG. 10.

Method of Fabricating Acoustic Resonator Package

Hereinafter, a method of manufacturing an acoustic resonator package according to an example of the present example will be described, and the contents overlapping with those described above will be omitted and the differences will be mainly described.

First, an operation of fabricating an acoustic resonator on one surface of a substrate will be described.

FIGS. 11 to 14 illustrate an operation of fabricating an acoustic resonator on one surface of a substrate.

Figure 11:
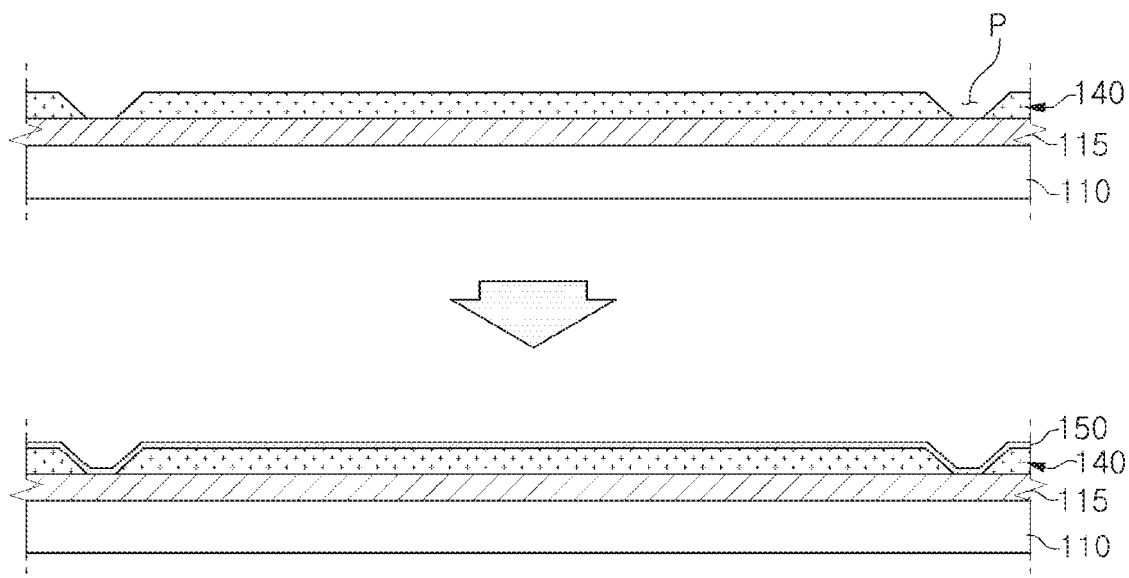
FIGS. 11 to 14 illustrate an example of an operation of fabricating an acoustic resonator on one surface of a substrate.

Referring to FIG. 11, an insulating layer 115 and a sacrificial layer 140 are formed on a substrate 110. A pattern is formed to penetrate through the sacrificial layer 140. Thus, the insulating layer 115 is exposed outward through the pattern P.

The insulating layer 115 and a membrane layer 150 may be formed of manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$) (ZnO), silicon nitride (SiN), silicon oxide (SiO$_2$) or the like, but is not limited thereto.

A pattern P formed on a sacrificial layer 140 may have a trapezoidal cross-sectional surface having an upper width that is greater than a lower width.

A portion of the sacrificial layer 140 may be removed through a subsequent etching process to form a cavity C (FIG. 2). Thus, a material of the sacrificial layer 140 may be polysilicon, polymer or the like which is readily etched, but is not limited thereto.

The membrane layer 150 may be formed on the sacrificial layer 140. The membrane layer 150 may be formed along a surface of the sacrificial layer 140 to have a constant thickness. The membrane layer 150 may have a smaller thickness than the sacrificial layer 140.

The membrane layer 150 may include at least one of silicon dioxide (SiO$_2$) and silicon nitride (Si$_3$N$_4$). In addition, the membrane layer 150 may include a dielectric layer containing at least one of manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO) or a metal layer containing at least one of aluminum (Al), nickel (Ni), chromium (Cr), platinum (Pt), gallium (Ga), and hafnium (Hf). However, the configuration of the examples is not limited thereto.

Although not shown in the drawings, a seed layer may be formed on the membrane layer 150.

The seed layer may be disposed between the membrane layer 150 and a first electrode 121 that will be described below. Although the seed layer may be formed of aluminum nitride (AlN), a material of the seed layer is not limited thereto and may be a dielectric or metal having an HCP structure. For example, when the seed layer is formed of a metal, the metal may be titanium (Ti).

Figure 12:
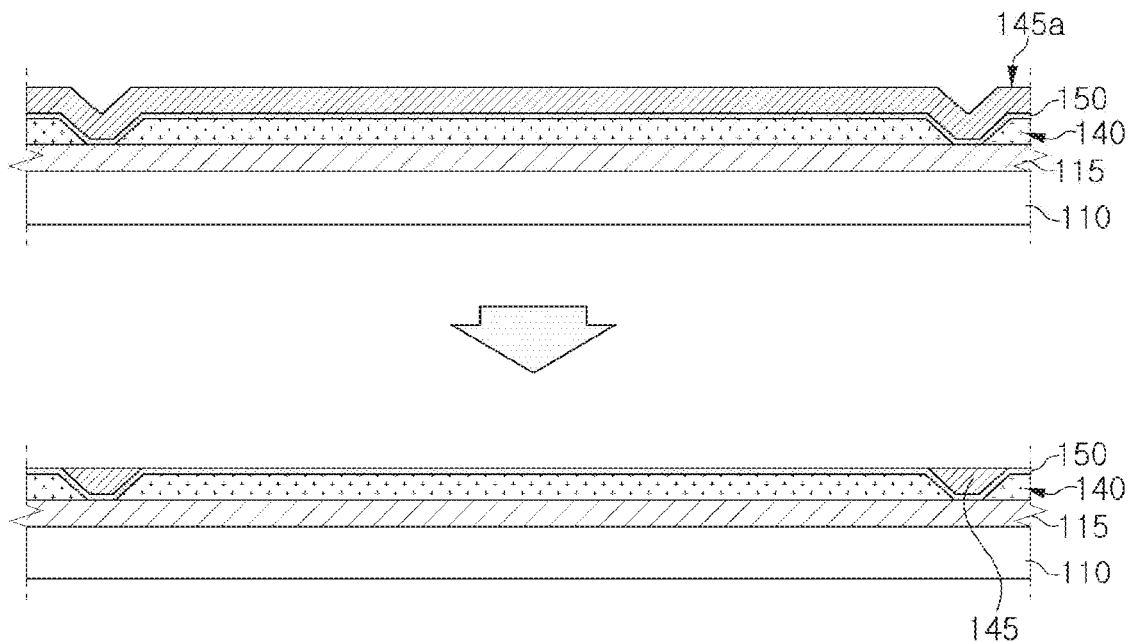

As shown in FIG. 12, an etch-stop layer 145a may be formed on the membrane layer 150. The etch-stop layer 145a also fills in the pattern P.

The etch-stop layer 145a may be formed to have a thickness that is enough to completely fill the pattern P. Thus, the etch-stop layer 145a may be formed to be thicker than the sacrificial layer 140.

The etch-stop layer 145a may be formed of the same material as the insulating layer 115, but is not limited thereto.

The etch-stop layer 145a is removed in such a manner that the membrane layer 150 is exposed outward.

At this point, a portion filling in the pattern P remains, and the remaining portion of the etch-stop layer 145a functions as an etch-stop portion 145.

Figure 13:
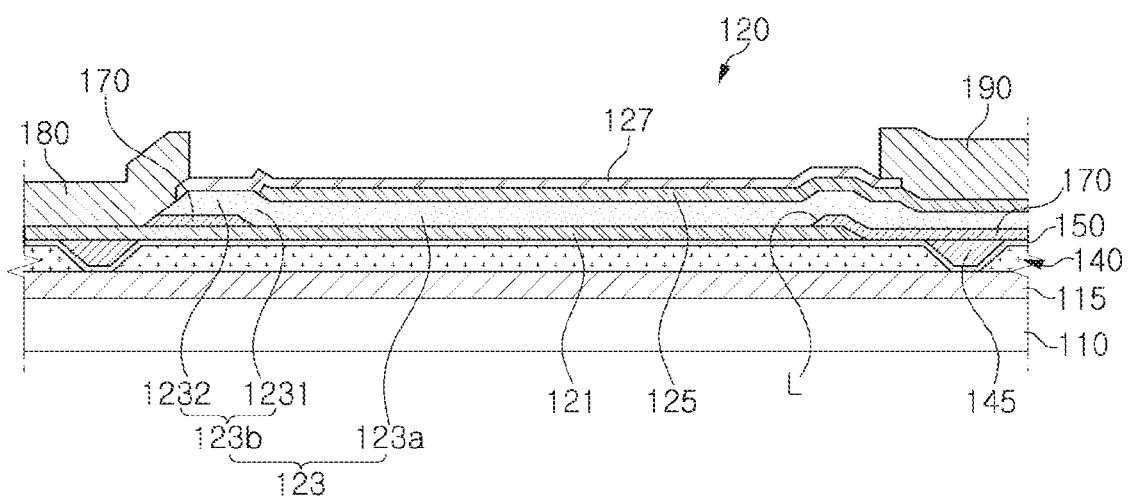

As shown in FIG. 13, a first electrode 121 may be formed on a top surface of the membrane layer 150.

In the present example, the first electrode 121 may be formed of a conductor, e.g., gold (Au), molybdenum (Mo), ruthenium (Ru), iridium (Ir), aluminum (Al), platinum (Pt), titanium (Ti), tungsten (W), palladium (Pd), tantalum (Ta), chromium (Cr), nickel (Ni) or a metal containing at least one thereof, but the present example is not limited thereto.

The first electrode 121 is formed on above a region in which a cavity (C in FIG. 3) is to be formed.

The first electrode 121 may be formed by removing an unnecessary portion after forming a conductive layer to cover the entire membrane layer 150.

If necessary, an insertion layer 170 may be formed. The insertion layer 170 may be formed on the first electrode 121, and may extend to an upper portion of the membrane layer 150, if necessary.

Since an extending portion 123b of the resonant portion 120 may be formed to be thicker than a center portion 123a if the insertion layer 170 is formed, vibration generated in the center portion 123a may be prevented from being transmitted to an outer edge. Thus, a Q-factor of the acoustic resonator may be increased.

The insertion layer 170 may be completed by being formed to cover an entire surface formed by the membrane layer 150, the first electrode 121, and the etch-stop layer 145 and removing a portion disposed in a region corresponding to the center portion S.

Accordingly, a center portion of the first electrode 121 constituting the center portion S may be exposed outwardly of the insertion layer 170. The insertion layer 170 may be formed to cover a portion of the first electrode 121 along a periphery of the first electrode 121. Accordingly, an outer edge portion of the first electrode 121 disposed in an extending portion E may be disposed below the insertion layer 170.

A side surface of the insertion layer 170 disposed adjacent to the center portion S may be formed as an inclined surface L. The insertion layer 170 becomes thinner as a distance from the center portion S decreases. Thus, a bottom surface of the insertion layer 170 may be formed to further extend to the center portion S than a top surface of the insertion layer 170. As mentioned above, an inclined angle of the inclined surface L of the insertion layer 170 may have a range between 5 and 70 degrees.

For example, the insertion layer 170 may be formed of a dielectric such as silicon oxide ($SiO_2$), aluminum nitride (AlN), aluminum oxide ($Al_2O_3$), silicon nitride (SiN), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), zinc oxide (ZnO) or similar types of materials, but may be formed of a material different from a material of a piezoelectric layer 123.

The piezoelectric layer 123 may be formed on the first electrode 121 and the insertion layer 170.

In the present example, the piezoelectric layer 123 may be formed of aluminum nitride (AlN). However, a material of the piezoelectric layer 123 is not limited thereto. Zinc oxide (ZnO), doped aluminum nitride, lead zirconate titanate (PZT), quartz or similar materials may be selectively used as the material of the piezoelectric layer 123. The doped aluminum nitride may further include a rare earth metal, a transition metal or an alkaline earth metal. For example, the rare earth meal may include at least one of scandium (Sc), erbium (Er), yttrium (Y), and lanthanum (La) and a content of the rare earth metal may be 1 to 20 atomic percent (at %). The transition metal may include at least one of hafnium (Hf), titanium (Ti), zirconium (Zr), tantalum (Ta), and niobium (Nb). The alkaline earth metal may include magnesium (Mg).

The piezoelectric layer 123 may be formed of a material different from the material of the insertion material 170.

The piezoelectric layer 123 may be formed by forming a piezoelectric material on an entire surface formed by the first electrode 121 and the insertion layer 170 and removing an unnecessary portion. In the present example, the piezoelectric layer 123 is completed by removing an unnecessary portion of the piezoelectric material after forming the second electrode 125. However, the completion of the piezoelectric layer 123 is not limited thereto, and the piezoelectric layer 123 may be completed before forming the second electrode 125.

The piezoelectric layer 123 is formed to cover a portion of the first electrode 121 and a portion of the insertion layer 170. Accordingly, the piezoelectric layer 123 is formed following a shape of a surface formed by the first electrode 121 and the insertion layer 170.

As mentioned above, only a portion corresponding to the center portion S of the first electrode 121 may be exposed outwardly. Thus, the piezoelectric layer 123 formed on the first electrode 121 is disposed within the center portion S. A bent portion 123b formed on the insertion layer 170 may be disposed within the extending portion E.

A second electrode 125 may be formed on the piezoelectric layer 123. In the present example, the second electrode 125 may be formed of a conductor, e.g., gold (Au), molybdenum (Mo), ruthenium (Ru), iridium (Ir), aluminum (Al), platinum (Pt), titanium (Ti), tungsten (W), palladium (Pd), tantalum (Ta), chromium (Cr), nickel (Ni) or a metal containing at least one thereof, but the present examples are not limited thereto.

The second electrode 125 may be formed on the piezoelectric portion 123a of the piezoelectric layer 123. As mentioned above, the piezoelectric portion 123a of the piezoelectric layer 123 is disposed within the center portion S. Accordingly, the second electrode 125 disposed on the piezoelectric layer 123 is also disposed within the center portion S.

In the present example, the second electrode 125 may also be formed on an inclined portion 1231 of the piezoelectric layer 123. Accordingly, the second electrode 125 may be entirely disposed in the center portion S and may be partially disposed at the extending portion E. The second electrode 125 may be partially disposed at the extending portion 123b, which may allow resonance performance to be significantly improved.

Figure 14:
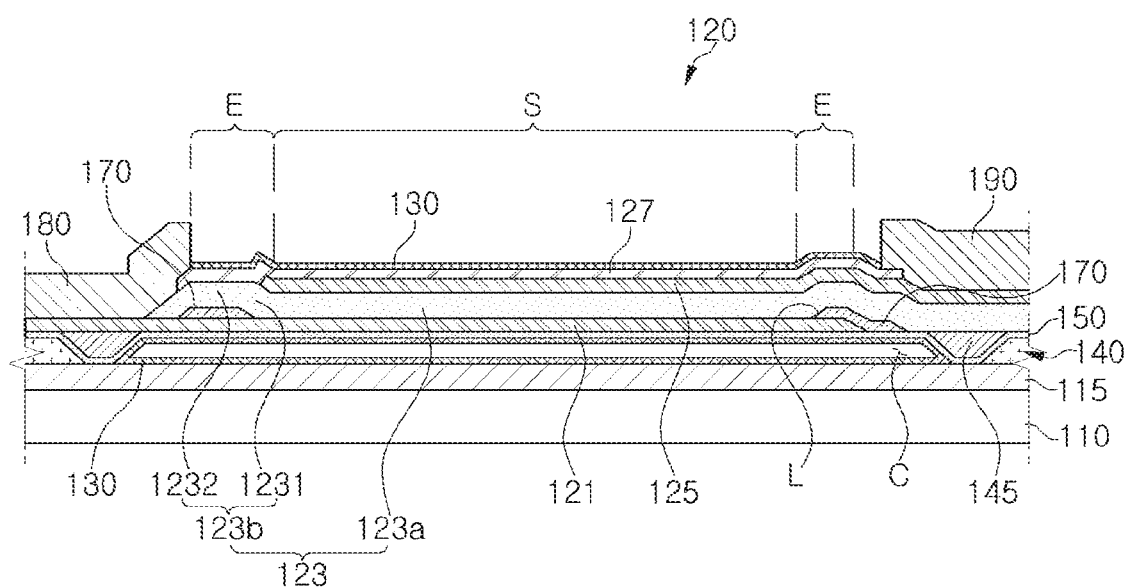

As shown in FIG. 14, a protective layer 127 may be formed.

The protective layer 127 may be formed along a surface formed by the second electrode 125 and the piezoelectric layer 123. Although not shown in the drawing, the protective layer 127 may be formed on the outwardly exposed insertion layer 170.

The protective layer 127 may be formed of one of silicon oxide-based, silicon nitride-based, aluminum oxide-based, and aluminum nitride-based insulating materials. However, the material of the protective layer 127 is not limited thereto.

After the protective layer 127 and the piezoelectric layer 123 are partially removed to partially expose the first electrode 121 and the second electrode 125, a first metal layer 180 and a second metal layer 190 may be formed in the exposed portions of the respective first and second electrodes 121 and 125.

Each of the first and second metal layers 180 and 190 may be formed of gold (Au), gold-tin (Au—Sn) alloy, copper (Cu), copper-tin (Cu—Sn) alloy, aluminum (Al), aluminum-germanium (Al—Ge) alloy or the like and may be deposited on the first electrode 121 or the second electrode 125, but is not limited thereto.

Still referring to FIG. 14, a cavity C may be formed.

The cavity C may be formed as a portion disposed in the etch-stop layer 145 is removed from the sacrificial layer 140. The removed portion of the sacrificial layer 140 may be removed through etching.

When the sacrificial layer 140 is formed of polysilicon or polymer, the sacrificial layer 140 may be removed through dry etching using a halide etching gas (e.g., XeFe) such as fluorine (F), chlorine (Cl) or similar types of gases.

A process of additionally etching the protective layer 127 may be performed to obtain target frequency characteristics.

According to the above-described method, an acoustic resonator package is manufactured by fabricating an acoustic resonator on a substrate, forming a hydrophobic layer on the acoustic resonator and the substrate, and accommodating the acoustic resonator in a cap.

Hereinafter, a process of bonding a cap to a substrate will be described in detail, and then a process of forming a hydrophobic layer will be described.

Figure 15:
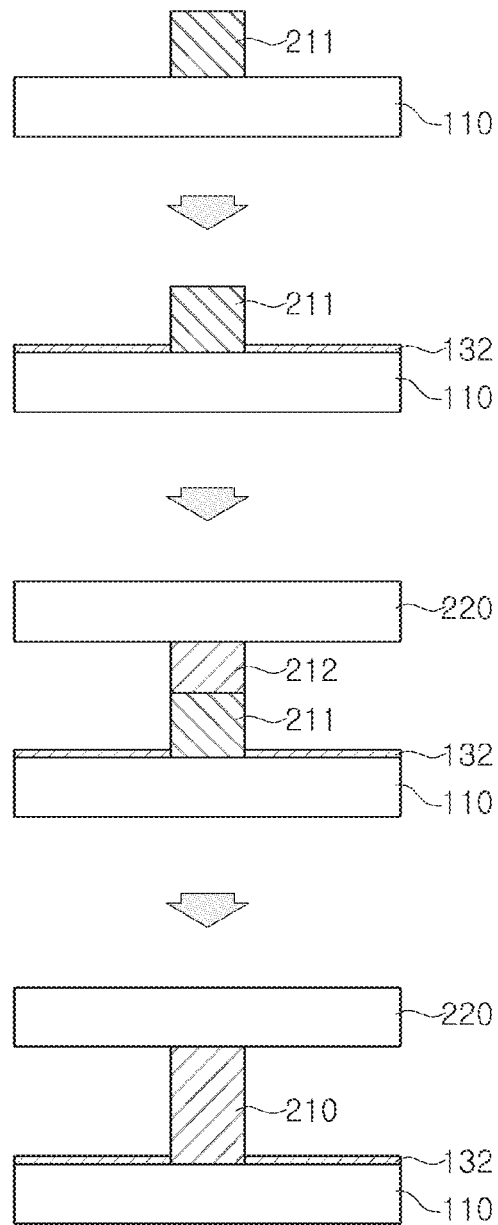
FIG. 15 illustrates a first example of bonding a cap to a substrate in a method of fabricating an acoustic resonator according to another example.

FIG. 15 illustrates a first example of bonding a cap to a substrate in a method of fabricating an acoustic resonator according to another example of the present disclosure.

Referring to FIG. 15, after an acoustic resonator is fabricated on a substrate 110 according to the above-described method, a first bonding portion 211 is formed on the substrate 110. The first bonding portion 211 may include a parent material used in typical eutectic bonding or metal diffusion bonding, e.g., copper (Cu), gold (Au), silver (Ag), nickel (Ni), aluminum (Al), lead (Pb) or similar materials. However, the parent material is not limited thereto.

According to the first example, since a process is not performed to a separate blocking layer, a hydrophobic layer may be formed on a first bonding portion 211. Thus, bonding strength may be lowered thus failing to maintain the hermeticity inside the acoustic resonator package. As a result, preferably, the first bonding portion may include silver (Au) on which it may be difficult to deposit the hydrophobic layer.

A hydrophobic layer 130 may be formed on the acoustic resonator and the substrate 110 according to a method of forming a hydrophobic layer which will be described below.

By bonding a second bonding portion 212 disposed on one surface of the cap to the first bonding portion 211, a bonding portion 210 may be formed to accommodate the acoustic resonator.

The bonding of the second bonding portion 212 to the first bonding portion 211 may be implemented through eutectic bonding or metal diffusion bonding. The second bonding portion 212 may include a melting material used in typical eutectic bonding or metal diffusion bonding, e.g., tin (Sn), indium (In), silicon (Si), zinc (Zn), germanium (Ge) or the like.

Eutectic bonding means that when different materials are brought into contact with each other, they melt at a temperature lower than their melting points at a specific composition, and thus an intermetallic compound is formed to perform bonding on opposite surfaces of the bonding material. Accordingly, a bonding-completed bonding portion 210 may include a parent material, a melting material, and an alloy thereof.

When the bonding portion is formed of a material on which a hydrophobic layer may easily be deposited, a separate blocking layer B is preferably formed to block the formation of the hydrophobic layer in the bonding portion, similar to second and third examples that will be described below. In the second and third examples, the same discussion as those described in the first example will not be described in further detail.

Figure 16:
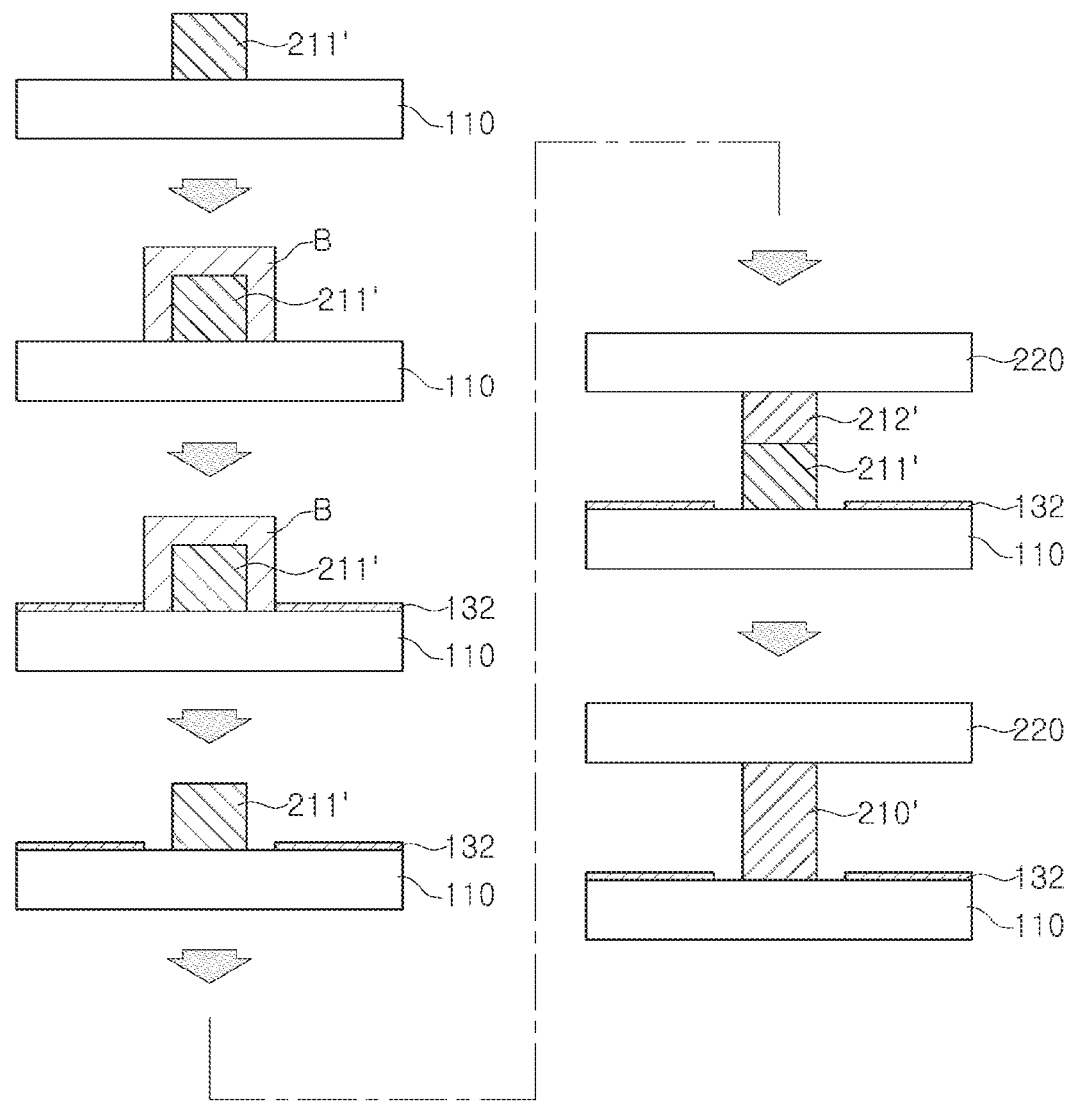
FIG. 16 illustrates a second example of bonding a cap to a substrate in a method of fabricating an acoustic resonator according to another example.

FIG. 16 illustrates a second example of bonding a cap to a substrate in a method of fabricating an acoustic resonator according to another example of the present disclosure.

Referring to FIG. 16, a first bonding portion 211' may be formed on a substrate after fabricating an acoustic resonator according to the above-described method.

A blocking layer B may be formed on an external surface of the first bonding portion 211'. Since the blocking layer B is removed in a subsequent process, the blocking layer B may be formed of any material which prevents a hydrophobic layer from being deposited on the first bonding portion 211'. For example, the blocking layer B may be formed of a photoresist, a film-type resin or the like.

A hydrophobic layer 130 may be formed on the acoustic resonator and the substrate according to a method of forming a hydrophobic layer that will be described below. After formation of the hydrophobic layer 130, the blocking layer B is removed. The removal of the blocking layer B formed between the first bonding portion 211' and a second hydrophobic layer 132 may cause the second hydrophobic layer 132 to be spaced apart from the first bonding portion 211'.

By bonding the second bonding portion 212' formed on one surface of a cap 220 to a second bonding portion 211' after removal of the blocking layer B, a bonding portion 210' is formed to accommodate the acoustic resonator.

Preferably, the second example may be applied to a case in which a hydrophobic layer is easily deposited because the first bonding portion 211' includes at least one of copper (Cu) and aluminum (Al). Undoubtedly, the first bonding portion 211' may also be applied to a case in which the first boning portion 211' is formed of a material on which a hydrophobic layer is difficult to be deposited.

Figure 17:
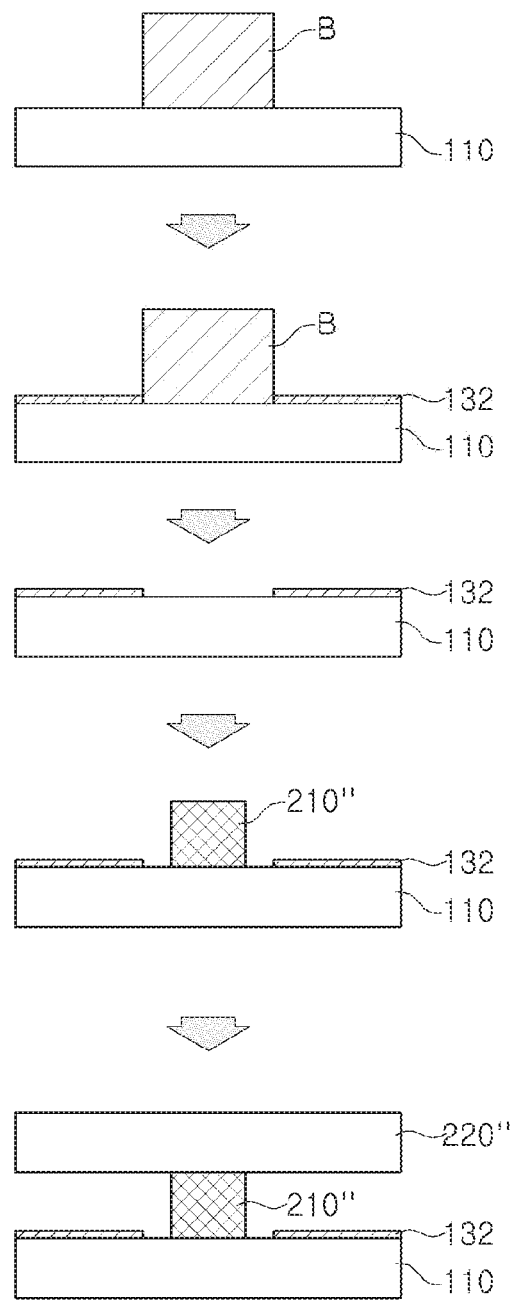
FIG. 17 illustrates a third example of bonding a cap to a substrate in a method of fabricating an acoustic resonator according to another example.

FIG. 17 illustrates a third example of bonding a cap to a substrate in a method of fabricating an acoustic resonator according to another example of the present disclosure.

Referring to FIG. 17, after fabricating an acoustic resonator on a substrate 110 according to the above-described method, a blocking layer B is formed at a position in which a bonding portion 210" in the substrate 110 is to be formed.

A hydrophobic layer 130 is formed on the acoustic resonator and the substrate 110 according to a method of forming a hydrophobic method that will be described below.

The blocking layer B is removed and the bonding portion 210" is formed on the substrate 110. Considering fabrication error, the blocking layer B may be set to be slightly larger than the bonding portion 210". Thus, a second hydrophobic layer 132 is spaced apart from the bonding portion 210".

A cap 220" is bonded to the bonding portion 210" to accommodate the acoustic resonator.

In the case of the third example, the bonding portion 210" may include a polymer and the cap 220" may include an organic insulating material. This is because the cap 220" is preferably bonded to the substrate 110 using the polymer in terms of securing a bonding strength when the cap 220" includes an organic insulating material.

Hereinafter, a method of forming a hydrophobic layer will be described in detail.

Figure 18:
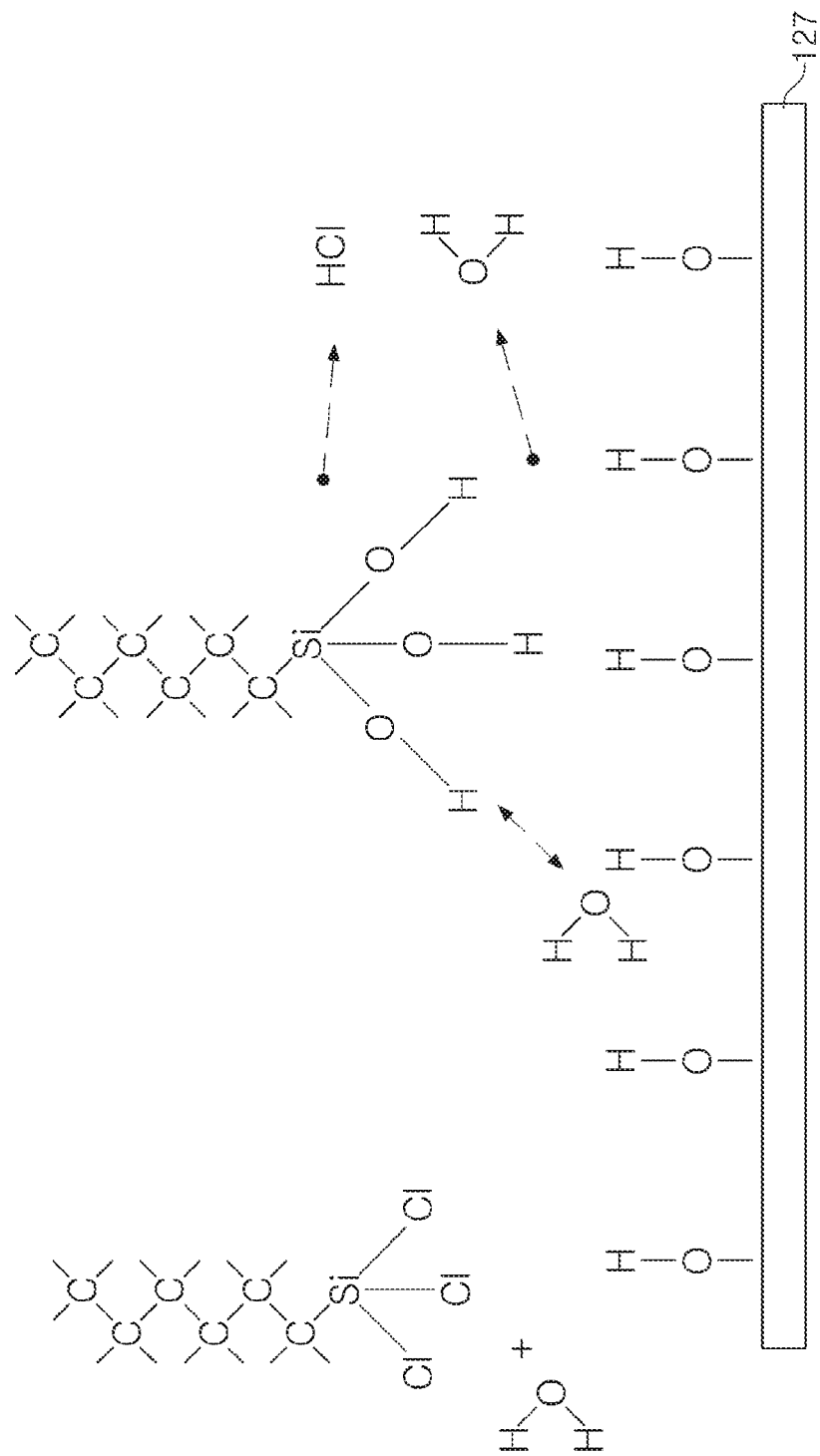
FIG. 18 illustrates formation of a hydrophobic layer in a method of fabricating an acoustic resonator according to another example.

FIG. 18 illustrates the formation of a hydrophobic layer in a method of fabricating an acoustic resonator according to another example of the present disclosure.

A hydrophobic layer 130 may be formed by depositing a hydrophobic material using chemical vapor deposition (CVD).

Hydroxylate may be formed on a surface of a protective layer 127 including $SiO_2$ in FIG. 18. The surface of the protective layer 127 may be treated by performing a hydrolyze silane reaction using a precursor having a silicon head in the hydroxylate.

When a fluorocarbon functional group is formed on the treated surface of the protective layer 127, a hydrophobic layer 130 is formed on the protective layer 127, as shown in FIG. 19.

According to a material of the protective layer 127, the surface treatment of the protective layer 127 may be omitted and a fluorocarbon functional group may be formed on the protective layer 127 to form a hydrophobic layer 130.

In the above-described operation of forming a hydrophobic layer, the second hydrophobic layer 132 is also formed on a substrate between a bonding portion and an acoustic resonator.

The first hydrophobic layer 131 may also be formed on a top surface of a cavity C (FIG. 2) through an introduction hole H (FIGS. 1 and 3). The first hydrophobic layer 131 may also be formed on at least one portion of bottom and side surfaces of the cavity C as well as the top surface of the cavity C. The first hydrophobic layer 131 may be formed on the top, bottom, and side surfaces of the cavity C.

The hydrophobic layer 130 may be formed of a monolayer or a self-assembled monolayer (SAM) rather than a polymer. Thus, the hydrophobic layer 130 may be formed to have a thickness of 100 angstroms (Å) or less, mass loading resulting from the hydrophobic layer 130 may be prevented from being applied to a resonant portion 120, and the hydrophobic layer 130 may have a uniform thickness.

As described above, a hydrophobic layer may be formed inside an acoustic resonator package. Thus, frequency variations of an acoustic resonator may be significantly reduced and performance of the acoustic resonator may be uniformly maintained even when the acoustic resonator package is used in a humid environment or left at room temperature for a long period of time, or a fault (or defect) occurs in a bonding portion of the acoustic resonator package to fail to maintain hermeticity of the acoustic resonator package.

Moreover, a hydrophobic layer is selectively deposited to be prevented from being formed on a bonding portion. For this reason, bonding strength between a substrate and a cap is not reduced by the hydrophobic layer. As a result, hermeticity of the acoustic resonant package may be maintained.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator package comprising:
   a substrate;
   an acoustic resonator disposed on the substrate, the acoustic resonator comprising a first hydrophobic layer;
   a cap configured to accommodate the acoustic resonator;
   a bonding portion configured to bond the substrate to the cap; and
   a second hydrophobic layer disposed on the substrate at a position between the acoustic resonator and the bonding portion.

2. The acoustic resonator package of claim 1, wherein the bonding portion comprises at least one of gold (Au) and an Au alloy.

3. The acoustic resonator package of claim 1, wherein the bonding portion comprises at least one of copper (Cu), a Cu alloy, aluminum (Al), and an Al alloy, and
   the second hydrophobic layer is disposed to be spaced apart from the bonding portion.

4. The acoustic resonator package of claim 1, wherein the bonding portion comprises a polymer, and
   the second hydrophobic layer is disposed to be spaced apart from the bonding portion.

5. The acoustic resonator package of claim 1, wherein the acoustic resonator comprises:
   an insulating layer disposed on the substrate;
   a membrane layer disposed on the insulating layer;
   a cavity region defined by the insulating layer and the membrane layer;
   a resonant portion in which a first electrode, a piezoelectric layer and a second electrode are laminated, the resonant portion being disposed above the cavity; and
   a protective layer disposed on the resonant portion,
   wherein the first hydrophobic layer is disposed on the protective layer.

6. The acoustic resonator package of claim 5, wherein:
   the first electrode and the second electrode extend outwardly of the resonant portion; a
   first metal layer is disposed on the extended first electrode;
   a second metal layer is disposed on the extended second electrodes; and
   the first hydrophobic layer is additionally disposed on the first metal layer and the second metal layer.

7. The acoustic resonator package of claim 6, wherein the first metal layer and the second metal layer comprise at least one of copper (Cu) and aluminum (Al).

8. The acoustic resonator package of claim 5, wherein the first hydrophobic layer is additionally disposed on a top surface of the cavity.

9. The acoustic resonator package of claim 8, wherein the first hydrophobic layer is additionally disposed on at least a portion of a bottom surface of the cavity and a side surface of the cavity.

10. The acoustic resonator package of claim 1, wherein each of the first hydrophobic layer and the second hydrophobic layer is one of a monolayer and a self-assembled monolayer.

11. The acoustic resonator package of claim 1, wherein the first hydrophobic layer and the second hydrophobic layer comprise a fluorine (F) component.

12. The acoustic resonator package of claim 11, wherein the first hydrophobic layer and the second hydrophobic layer further comprise a silicon (Si) component.

* * * * *